United States Patent
Tu et al.

(10) Patent No.: US 11,147,157 B2
(45) Date of Patent: *Oct. 12, 2021

(54) SUBSTRATE STRUCTURE WITH HIGH REFLECTANCE AND METHOD FOR MANUFACTURING THE SAME

(71) Applicant: UNIFLEX Technology Inc., Taichung (TW)

(72) Inventors: Cheng-I Tu, Tainan (TW); Ying-Hsing Chen, Taichung (TW); Meng-Huan Chia, Taichung (TW); Hsin-Ching Su, Miaoli County (TW); Yi-Chun Liu, New Taipei (TW); Cheng-Chung Lai, Changhua County (TW); Yuan-Chih Lee, Taoyuan (TW)

(73) Assignee: UNIFLEX Technology Inc., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/894,883

(22) Filed: Jun. 8, 2020

(65) Prior Publication Data

US 2020/0305276 A1    Sep. 24, 2020

Related U.S. Application Data

(62) Division of application No. 16/387,540, filed on Apr. 18, 2019, now Pat. No. 10,729,007.

(Continued)

(30) Foreign Application Priority Data

Feb. 21, 2019    (TW) .................................. 108105862

(51) Int. Cl.
*H05K 1/02*    (2006.01)
*H05K 1/11*    (2006.01)
(Continued)

(52) U.S. Cl.
CPC ........... *H05K 1/0274* (2013.01); *H05K 1/115* (2013.01); *H05K 3/28* (2013.01); *H05K 3/46* (2013.01);
(Continued)

(58) Field of Classification Search
CPC ........ H05K 1/0274; H05K 1/115; H05K 3/28; H05K 3/46; H05K 2201/10106; H05K 2201/2054
See application file for complete search history.

(56) References Cited

U.S. PATENT DOCUMENTS

| 10,729,007 | B2 * | 7/2020 | Tu ............................ H05K 3/28 |
| 2011/0204389 | A1 * | 8/2011 | Kasakura ................ H01L 33/50 |
| | | | 257/88 |

(Continued)

FOREIGN PATENT DOCUMENTS

| JP | 2008009006 | 1/2008 |
| JP | 2009152161 | 7/2009 |

(Continued)

OTHER PUBLICATIONS

"Office Action of Japan Counterpart Application", dated Aug. 4, 2020, p. 1-p. 5.

*Primary Examiner* — Ishwarbhai B Patel
(74) *Attorney, Agent, or Firm* — JCIPRNET

(57) ABSTRACT

A substrate structure with high reflectance includes a base material, a patterned circuit layer, an insulating layer and a metal reflecting layer. The base material includes a first surface and a second surface opposite to the first surface. The patterned circuit layer is disposed on the first surface. The insulating layer covers the patterned circuit layer and a part of the first surface exposed by the patterned circuit layer. The metal reflecting layer covers the insulating layer, and a reflectance of the metal reflecting layer is substantially (Continued)

greater than or equal to 85%. A manufacturing method of a substrate structure with high reflectance is also provided.

10 Claims, 12 Drawing Sheets

Related U.S. Application Data

(60) Provisional application No. 62/784,769, filed on Dec. 25, 2018.

(51) Int. Cl.
  H05K 1/03 (2006.01)
  H05K 3/46 (2006.01)
  H05K 3/28 (2006.01)
  *H01L 33/60* (2010.01)
  *H01L 33/62* (2010.01)

(52) U.S. Cl.
  CPC ............. *H01L 33/60* (2013.01); *H01L 33/62* (2013.01); *H01L 2933/0058* (2013.01); *H01L 2933/0066* (2013.01); *H05K 1/0313* (2013.01); *H05K 3/4602* (2013.01); *H05K 2201/0108* (2013.01); *H05K 2201/0129* (2013.01); *H05K 2201/0154* (2013.01); *H05K 2201/10106* (2013.01); *H05K 2201/2054* (2013.01)

(56) References Cited

U.S. PATENT DOCUMENTS

| | | | |
|---|---|---|---|
| 2012/0019936 A1* | 1/2012 | Blessing | C09D 11/101 359/742 |
| 2014/0293436 A1* | 10/2014 | Nagahama | E06B 9/386 359/634 |
| 2015/0303360 A1* | 10/2015 | Yoo | H01L 33/60 257/98 |
| 2016/0197253 A1* | 7/2016 | Miyashita | H01L 33/62 257/89 |
| 2017/0123117 A1* | 5/2017 | Nakagawa | G02B 5/0808 |
| 2019/0067541 A1* | 2/2019 | Kato | H01L 33/62 |

FOREIGN PATENT DOCUMENTS

| | | |
|---|---|---|
| JP | 2013519233 | 5/2013 |
| JP | 2013225643 | 10/2013 |
| JP | 2014103406 | 6/2014 |
| JP | 2015162521 | 9/2015 |
| JP | 2017028190 | 2/2017 |
| JP | 2018185509 | 11/2018 |

* cited by examiner

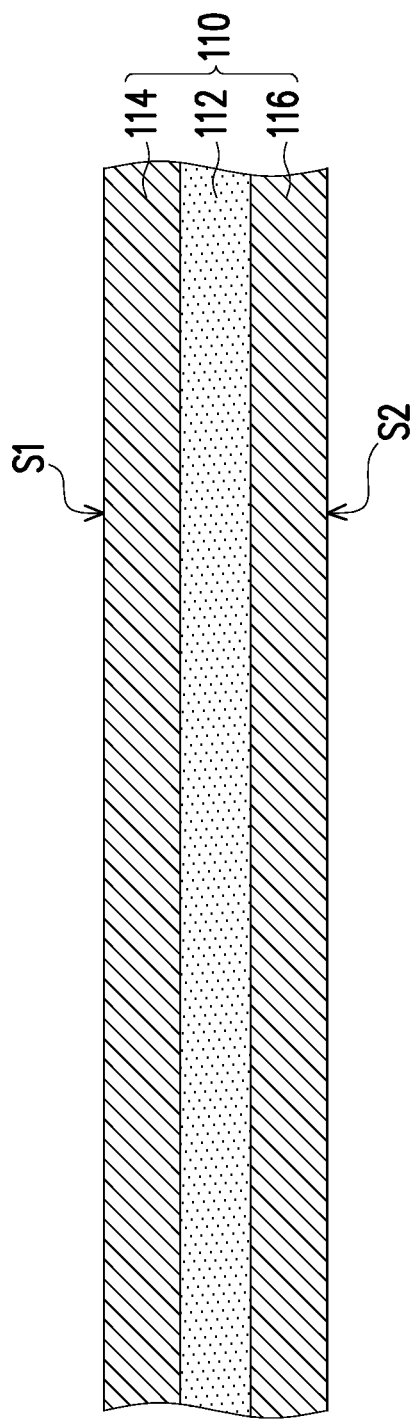
FIG. 1
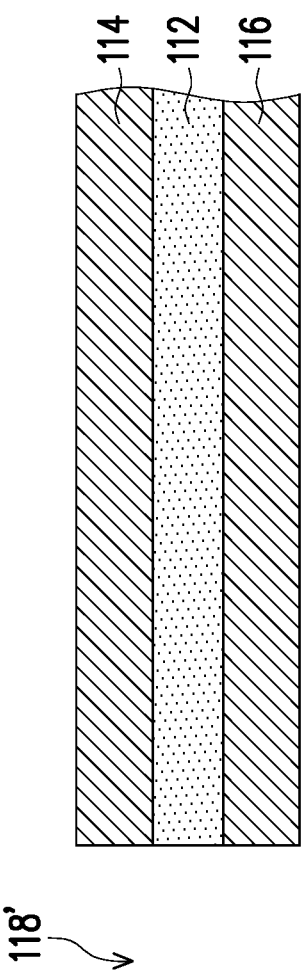
FIG. 2
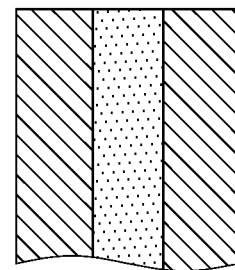

SUBSTRATE STRUCTURE WITH HIGH REFLECTANCE AND METHOD FOR MANUFACTURING THE SAME

CROSS-REFERENCE TO RELATED APPLICATION

This application is a divisional application of and claims the priority benefit of U.S. application Ser. No. 16/387,540, filed on Apr. 18, 2019, now allowed (Patent No.: US107290072B2), which claims the priority benefits of U.S. provisional application Ser. No. 62/784,769, filed on Dec. 25, 2018, and Taiwan application serial no. 108105862, filed on Feb. 21, 2019. The entirety of each of the above-mentioned patent applications is hereby incorporated by reference herein and made a part of specification.

BACKGROUND

Technical Field

The present disclosure generally relates to a substrate structure and a method for manufacturing the same. More particularly, the present disclosure relates to a substrate structure with high reflectance and a method for manufacturing the same.

Description of Related Art

With the development of technologies such as aerospace technology, electronic technology, and battery technology, in some specific situations, the requirements for characteristics of polyimide film have become more diverse and refined. Nowadays, more advanced polyimide film products have been developed, such as corona-resistant polyimide film, low dielectric polyimide film, and transparent polyimide film. In some specific areas, such as the areas of flexible light bars with LEDs and backlight modules of displays, the great improvement in reflectance of polyimide films is highly expected from the industries.

In order to increase the reflectance of the polyimide film, it is known to additionally form a white film layer (for example, a white resin layer) or a baking type ink, a photosensitive ink, or the like, on a general polyimide film to form a so-called dual-layered polyimide film. While this approach allows the polyimide film to present the desired white color, the additional white film layer (coverlay) typically adds to the cost of fabrication, and current methods still fail to achieve the desired high reflectance.

SUMMARY

Accordingly, the present disclosure is directed to a substrate structure with high reflectance and a method for manufacturing the same, which can achieve extremely high reflectance.

The present disclosure is directed to a substrate structure with high reflectance includes a base material, a first patterned circuit layer, a second patterned circuit layer, a first insulation layer, and a metal reflection layer. The base material includes a first surface and a second surface opposite to the first surface. The first patterned circuit layer is disposed on the first surface. The second patterned circuit layer is disposed on the second surface. The first insulation layer covers the first patterned circuit layer and a portion of the first surface exposed by the first patterned circuit layer. A metal reflection layer covers the first insulation layer, wherein a reflectance of the metal reflection layer is substantially greater than or equal to 85%.

According to an embodiment of the present disclosure, the metal reflection layer comprises aluminum, silver, gold, copper, ruthenium, chromium, molybdenum, platinum, nickel, iron layers or any combination thereof.

According to an embodiment of the present disclosure, the first insulation layer includes an ink layer, a polyimide layer, a thermoplastic polyimide layer, a resin layer, a photo-imageable coverlay (PIC), a dry film solder resist (DFSR) or insulation adhesive layer.

According to an embodiment of the present disclosure, the substrate structure with high reflectance further includes an ink layer disposed between the first insulation layer and the metal reflection layer.

According to an embodiment of the present disclosure, the substrate structure with high reflectance further includes a protection layer covering the metal reflection layer.

According to an embodiment of the present disclosure, the protection layer is a transparent polymer protective layer having a heat resistant temperature substantially greater than or equal to 200° C. and/or a light transmittance substantially greater than or equal to 80%.

According to an embodiment of the present disclosure, the protection layer includes a polyimide layer, a polyphenylene sulfide (PPS) layer or a polyphenylene sulfone (PPSU) layer.

According to an embodiment of the present disclosure, the substrate structure with high reflectance further includes an adhesive layer disposed between the first patterned circuit layer and the first insulation layer.

According to an embodiment of the present disclosure, the substrate structure with high reflectance further includes a conductive vias extending through the base material and electrically connected to the first patterned circuit layer and the second patterned circuit layer.

According to an embodiment of the present disclosure, the substrate structure with high reflectance further includes a second insulation layer disposed on the second patterned circuit layer and a portion of the second surface exposed by the second patterned circuit layer.

According to an embodiment of the present disclosure, the substrate structure with high reflectance further includes a bonding layer disposed between the first insulation layer and the metal reflection layer.

According to an embodiment of the present disclosure, the bonding layer includes a thermoplastic polyimide layer or an adhesive layer.

The present disclosure provides a method for manufacturing a substrate structure with high reflectance including the following steps. A base material is provided. A first patterned circuit layer and a second patterned circuit layer are formed on a first surface and a second surface of the base material respectively. A first insulation layer and a metal reflection layer are provided on the first patterned circuit layer and a portion of the first surface exposed by the first patterned circuit layer, wherein the metal reflection layer covers the first insulation layer and a reflectance of the metal reflection layer is substantially greater than or equal to 85%.

According to an embodiment of the present disclosure, the method of forming the metal reflection layer includes sputtering, evaporation, plating, electroplating, chemical displacement reaction or silver mirror reaction.

According to an embodiment of the present disclosure, the manufacturing method of the substrate structure with high reflectance further includes: forming a protection layer on the metal reflection layer.

According to an embodiment of the present disclosure, the manufacturing method of the substrate structure with high reflectance further includes: forming an adhesive layer between the insulation layer and the first patterned circuit layer.

According to an embodiment of the present disclosure, the manufacturing method of the substrate structure with high reflectance further includes: forming a second insulation layer on the second patterned circuit layer and a portion of the second surface exposed by the second patterned circuit layer.

According to an embodiment of the present disclosure, the manufacturing method of the substrate structure with high reflectance further includes: forming an ink layer on the first insulation layer before the metal reflection layer is formed.

According to an embodiment of the present disclosure, the method of forming the ink layer includes screen printing, jet printing, spray coating or film overlay.

Based on the above, embodiments of the present disclosure provide a substrate structure with high reflectance and a manufacturing method thereof, the surface of the substrate structure is provided with a metal reflection layer with high reflectance, and the reflectance of the metal reflection layer is about 85% or more. Preferably, the reflectance of the metal reflection layer may be greater than or equal to 90%, thereby improving the light reflection efficiency of the substrate structure. In such a configuration, when light-emitting elements such as light-emitting diodes or micro-light-emitting diodes are disposed on the substrate structure to be used as an optical apparatus such as a backlight panel or a light bar, the optical apparatus can be effectively increased in light extraction efficiency.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1 to FIG. 5 are schematic cross-sectional views showing a manufacturing process of a substrate structure with high reflectance according to an embodiment of the disclosure.

DESCRIPTION OF THE EMBODIMENTS

Figure 3:
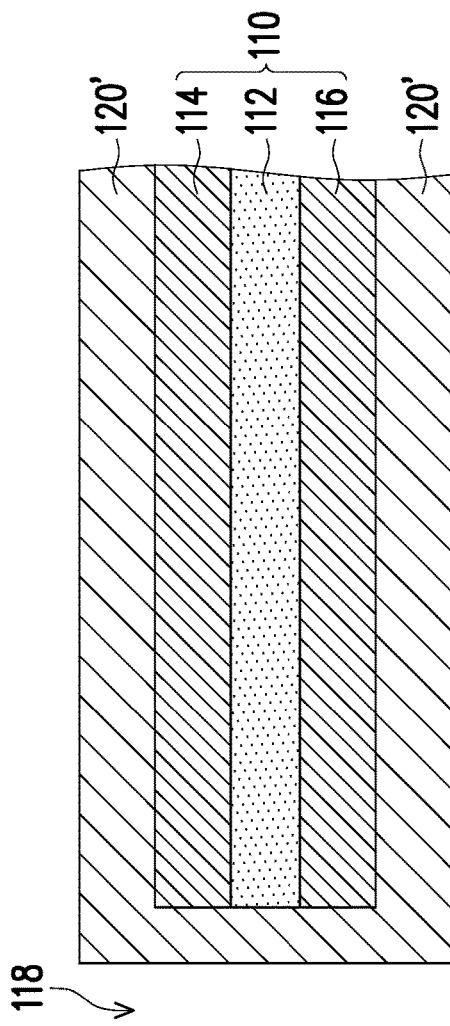
Figure 3:
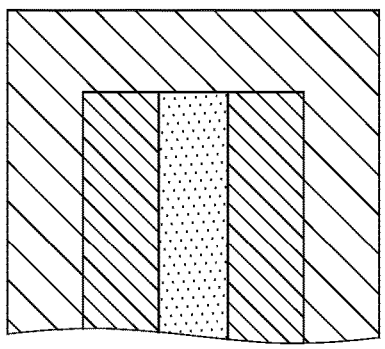

Reference will now be made in detail to the present preferred embodiments of the disclosure, examples of which are illustrated in the accompanying drawings. Wherever possible, the same reference numbers are used in the drawings and the description to refer to the same or like parts.

The present disclosure will now be described more fully with reference to the accompanying drawings, in which exemplary embodiments of the disclosure are shown. The terms used herein such as "on", "above", "below", "front", "back", "left" and "right" are for the purpose of describing directions in the figures only and are not intended to be limiting of the disclosure. Moreover, in the following embodiments, the same or similar reference numbers denote the same or like components.

FIG. 1 to FIG. 5 are schematic cross-sectional views showing a manufacturing process of a substrate structure with high reflectance according to an embodiment of the disclosure. In the present embodiment, the manufacturing method of the substrate structure having high reflectance may include the following steps. Firstly, referring to FIG. 1, a base material 112 is provided. In the present embodiment, the base material 112 may include a first surface S1 and a second surface S2 opposite the first surface S1. In some embodiments, the first surface S1 and the second surface S2 of the base material 112 may be covered by two metal foil layers 114, 116 to form a flexible copper clad laminate (FCCL) 110 as shown in FIG. 1. That is, the flexible copper clad laminate 110 may include a base material 112 and two metal foil layers 114, 116 covering the opposite surfaces of the base material 112 respectively. For example, the material of the base material 112 may include Polyimide (PI), thermoplastic polyimide (TPI) or the like, and the metal foil layer 114, 116 may be, for example, a copper foil, which may be provided on the base material 112 by methods such as lamination, adhesive bonding or thermo-lamination, or the like. The embodiments of the present disclosure are not limited thereto. In other embodiments, the base material 112 and the metal foil layers 114, 116 may also adopt other suitable materials.

Next, referring to FIG. 2, in the present embodiment, a plurality of vias 118' as shown in FIG. 2 can be formed on the base material 112 (or flexible copper clad laminate 110). In this embodiment, the forming method of the vias 118' may include forming a through hole on the base material 112 by, for example, a mechanical drilling process or a laser drilling process to penetrate through the base material 112 for connecting the first surface S1 and the second surface. In other embodiments, the vias 118' may also be a plurality of blind holes and/or buried holes connected to one another. The embodiment of the present disclosure does not limit the form of the vias 118' as long as the vias 118' connecting the first surface S1 and the second surface S2.

Referring to FIG. 3, in the present embodiment, a conductive layer 120' may be formed on the base material 112 (or the copper foil substrate 110) to cover the first surface S1 and the second surface S2 of the base material 112 in a comprehensive manner. Moreover, the conductive layer 120' may comprehensively (e.g., entirely) cover the inner wall of the vias 118' to form a plurality of conductive vias 118, which are electrically connected to the first surface S1 and the second surface S2. In the present embodiment, the method of forming the conductive layer 120' may include electroplating, but the embodiment of the disclosure is not limited thereto.

Figure 4:
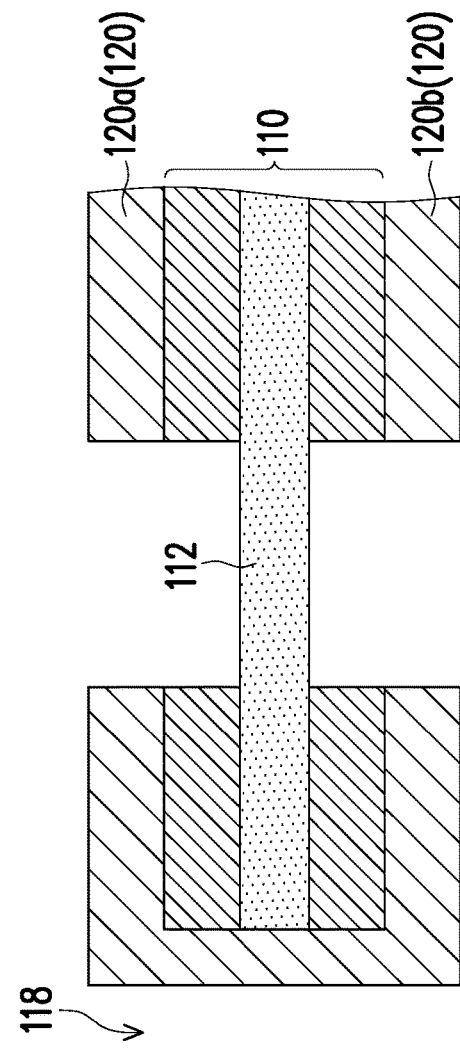
Figure 4:
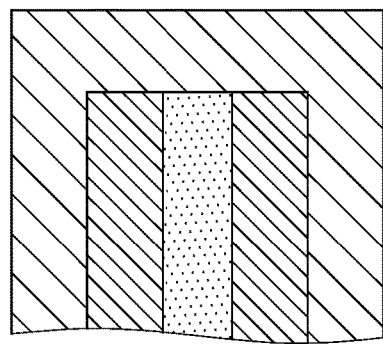

Next, referring to FIG. 4, in the embodiment, a patterning process may be performed on the conductive layer 120' and the two metal foil layers 114, 116 disposed on the base material 112 to form a patterned circuit layer 120 at least partially covering the first surface S1 and the second surface S2 of the base material 112. That is to say, the patterned circuit layer 120 may include the patterned conductive layer and the patterned metal foil layers. To be more specific, the patterned circuit layer 120 may include a first patterned circuit layer 120a disposed on the first surface S1 and a second patterned circuit layer 120b disposed on the second surface S2. In some embodiments, the first patterned circuit layer 120a and the second patterned circuit layer 120b may expose portions of the surface of the base material 112 as shown in FIG. 4, respectively. In the present embodiment, the patterning process may include a lithography process or other suitable method. The conductive vias 118 extend through the base material 112 and are electrically connected to the first patterned circuit layer 120a and the second patterned circuit layer 120b.

Figure 5:
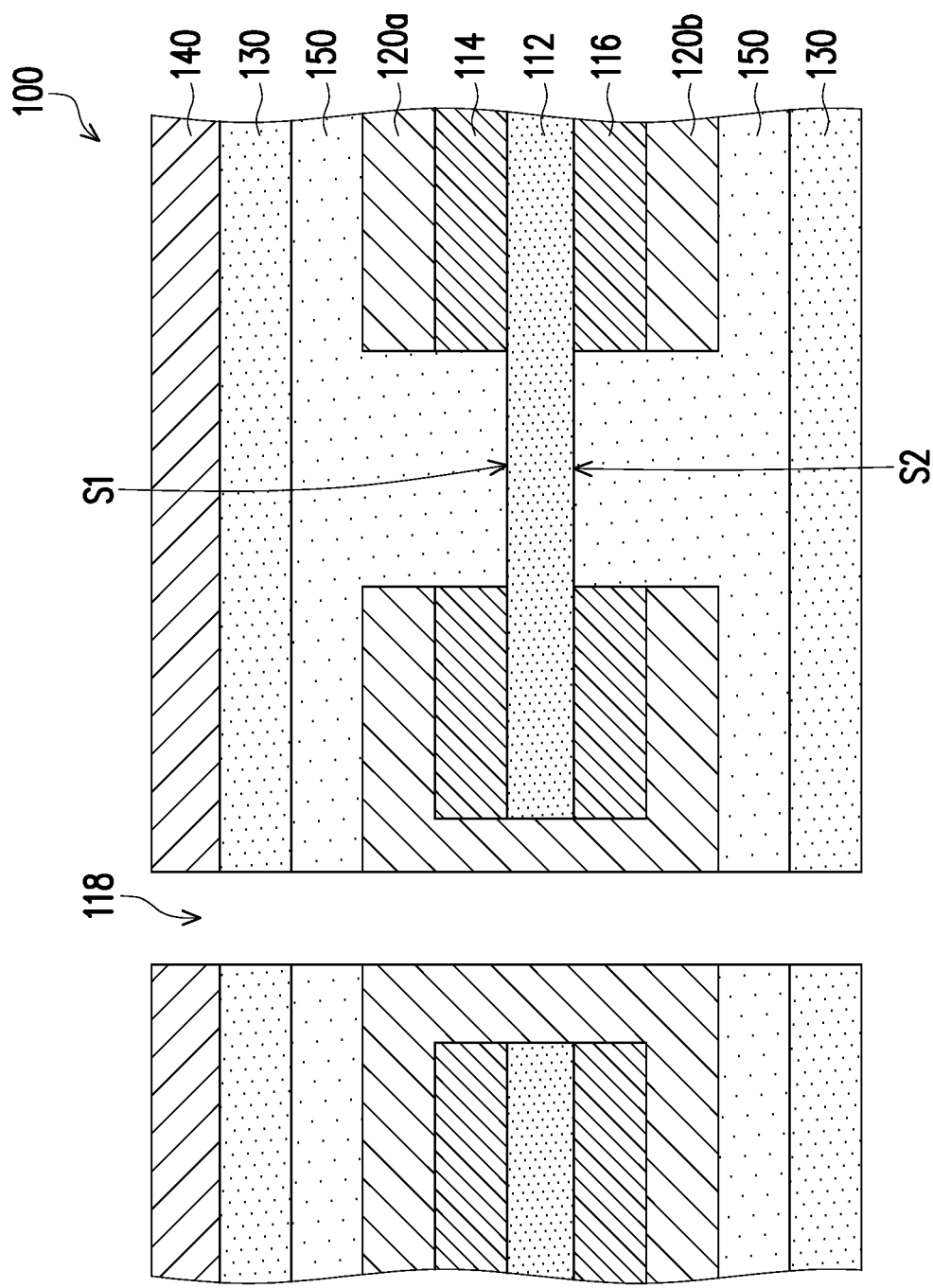

Referring to FIG. 5, in the present embodiment, a first insulation layer 130 and a metal reflection layer 140 are provided on the first patterned circuit layer 120a and a portion of the first surface S1 exposed by the first patterned circuit layer 120a. In the present embodiment, the metal reflection layer 140 covers the first insulation layer 130, and a reflectance of the metal reflection layer 140 is substantially greater than or equal to 85%. Preferably, the reflectance of the metal reflection layer 140 of the present embodiment may be greater than or equal to 90%. In some embodiments, a second insulation layer 130 may be formed on the second patterned circuit layer 120b and a portion of the second surface S2 exposed by the second patterned circuit layer 120b while forming the first insulation layer 130. In the present embodiment, the first insulation layer 130 may be used to electrically insulate the first patterned circuit layer 120a from the metal reflection layer 140.

In this embodiment, the insulation layer 130 may be a polyimide (PI) layer, a thermoplastic polyimide (TPI), a resin layer, a photo-imageable coverlay (PIC), a dry film solder resist (DFSR) or other similar material modified or improved based on the above materials. The insulation layer 130 may be applied to the first patterned circuit layer 120a, the second patterned circuit layer 120b, and the portions of the first surface S1 and the second surface S2 exposed by the first patterned circuit layer 120a and the second patterned circuit layer 120b by for example, the adhesive layer 150. In some embodiments, the first insulation layer 130 covering the first patterned circuit layer 120a and the first surface S1 may be a polyimide layer mixed with dye (or ink). That is to say, the first insulation layer 130 of the present embodiment may be formed by using polyimide as a base and mixing with dyes of other color. For example, in some embodiments, the first insulation layer 130 may be a polyimide layer mixed with a white filler (dye), such that the first insulation layer 130 mixed with the white filler is substantially white in color, or is a light-coloured insulation layer 130 of which the brightness is very close to white. Accordingly, the reflectance of the substrate structure 100 can be further improved.

In the present embodiment, the metal reflection layer 140 may be formed on the first insulation layer 130 by, for example, sputtering, evaporation, electroless plating, electroplating, chemical displacement reaction, or silver mirror reaction, etc. For example, the metal reflection layer 140 can include aluminium, silver, gold, copper, tantalum, chromium, molybdenum, platinum, nickel, iron layers, or any combination thereof, or other metal layers with high reflectance. In this embodiment, the reflectance of silver at a wavelength of 800 nm can be as high as about 99.2%, and the reflectance at a wavelength of 500 nm may also reach about 97.9%. Therefore, silver can be an optimal material for the metal reflection layer 140 at visible wavelengths and near-infrared wavelengths. In addition, aluminium also has good reflectance at wavelengths such as near-ultraviolet, visible, and near-infrared light (aluminium has a reflectance of about 86.7% at a wavelength of 800 nm and a reflectance of about 91.8% at a wavelength of 500 nm). However, due to its soft and oxidative properties, the surface of the metal reflection layer 140 must be coated (plated) with a protection layer when aluminium is adopted as material of the metal reflection layer 140. The metal reflection layer 140 may also be coated (plated) with a metal or non-metal film to increase its reflectance at certain wavelengths. The reflectance of gold and copper at wavelengths between 650 nm and 800 nm is also favourable (the reflectance of gold is about 98.0% at a wavelength of 800 nm and is about 95.5% at a wavelength of 650 nm; the reflectance of copper is about 98.1% at a wavelength of 800 nm and is about 96.6% at a wavelength of 650 nm), but the reflectance of gold and copper at a wavelength of 500 nm is rather poor, so gold and copper can also be adopted as the material of the metal reflection layer 140 at wavelengths of 800 nm and 650 nm. Of course, this embodiment is for illustrative purposes only and is not intended to limit the material of the metal reflection layer 140.

At this point, the manufacturing process of the substrate structure 100 with high reflectance of the present embodiment is substantially completed. Moreover, since the substrate structure 100 is provided with a metal reflection layer 140 with high reflectance, the light extraction efficiency thereof can be improved. In such a configuration, when light-emitting elements such as light-emitting diodes or micro-light-emitting diodes are disposed on the substrate structure 100 to be used as an optical apparatus such as a backlight panel or a light bar, light extraction efficiency of the optical apparatus can be effectively improved.

Figure 6:
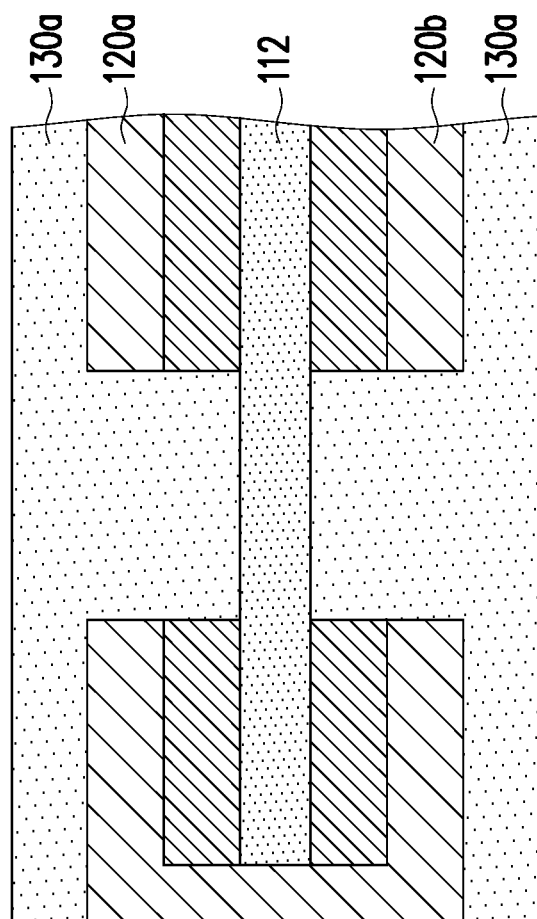
FIG. 6 to FIG. 7 are schematic cross-sectional views showing a partial manufacturing process of a substrate structure with high reflectance according to an embodiment of the disclosure.
Figure 6:
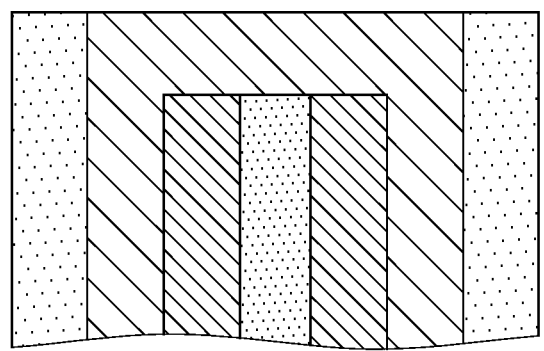
Figure 7:
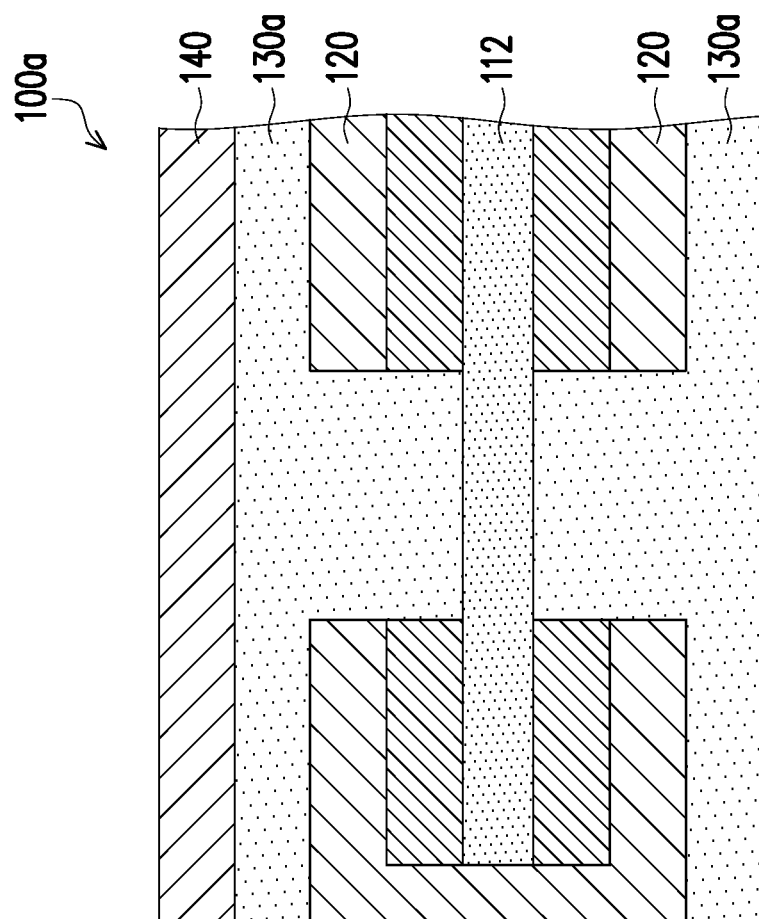
Figure 7:
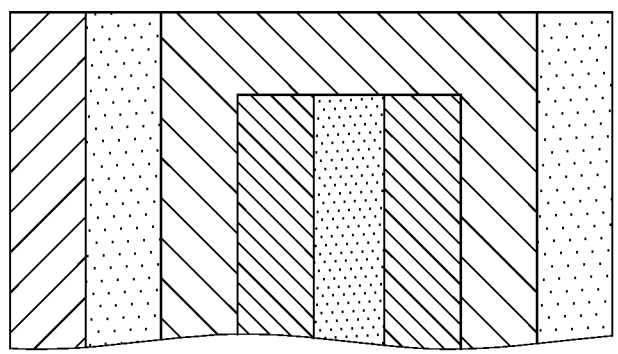

FIG. 6 to FIG. 7 are schematic cross-sectional views showing a partial manufacturing process of a substrate structure with high reflectance according to an embodiment of the disclosure. It should be noted that the substrate structure 100a of the present embodiment is similar to the substrate structure 100 of FIG. 5. Therefore, the same or similar reference numbers are adopted to denote the same or similar elements, and the description of the same or similar technical content may be omitted. For the description of the omitted part, reference may be made to the foregoing embodiment, and the description is not repeated herein. Referring to FIG. 6 and FIG. 7, the main differences between the substance structure 100a of the present embodiment and the substance structure 100 of FIG. 5 will be described below.

Referring to FIG. 6 and FIG. 7, in the present embodiment, after the substrate structure shown in FIG. 4 is formed, the first and second insulation layers 130a may be respectively formed on two opposite surfaces of the substrate structure shown in FIG. 4. In this embodiment, the insulation layer 130a may be a baking type ink layer, which may be formed on the two opposite surfaces of the structure shown in FIG. 4 by, for example, screen printing, jet printing, spray coating, or film attaching (e.g., making the ink in a dry film form and then performing film attachment). Then, the insulation layer 130a may be subjected to a baking process to evaporate the solvent contained in the ink to cure the insulation layer 130a. In other embodiments, the insulation layer 130a may also be a liquid photo imageable (LPI) ink layer, which may be applied to the two opposite surfaces of the structure shown in FIG. 4 by, for example, screen printing, jet printing, spray coating, or film attaching (e.g., making the ink in a dry film form and then performing film attachment). Then, the insulation layer 130a may be subjected to an exposure and development process to cure the liquid photo imageable ink layer or perform a patterning process on the liquid photo imageable ink layer according actual requirements. In this embodiment, the above-described baking type ink layer and liquid photo imageable ink layer can both be seen as a coverlay of the substitute structure. In some embodiments, the first insulation layer 130a disposed on the first patterned circuit layer 120a and the base material 110 may be an ink layer mixed with dye. That is, the first insulation layer 130a of the present embodiment may be a coloured ink layer, which may be formed by using ink as a base and mixing with dyes of other color. For example, the first insulation layer 130a may be an ink layer mixed with white filler (dye). Accordingly, the first insulation layer 130a mixed with white filler is substantially white in color, or a light-coloured insulation layer having a brightness close to white. Therefore, the reflectance of the substrate structure 100a can be further improved. In the present embodiment, the reflectance of the first insulation layer 130a mixed with the white filler is substantially greater than the reflectance of the ink without being mixed with the white filler. Thereafter, a metal reflection layer 140 may be formed on the first insulation layer 130a by, for example, sputtering, evaporation, electroless plating, electroplating, chemical displacement reaction, or silver mirror reaction, etc., to form the substrate structure 100a as shown in FIG. 7.

Figure 8:
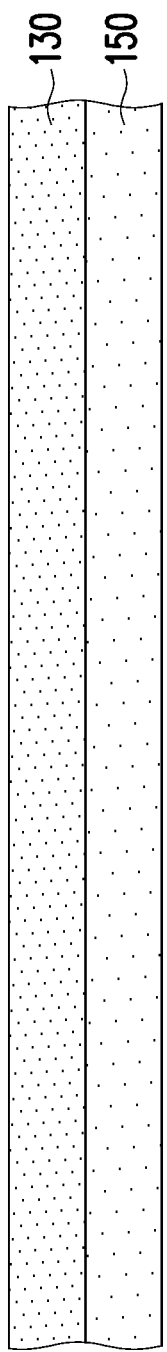
FIG. 8 to FIG. 9 are schematic cross-sectional views showing a partial manufacturing process of a substrate structure with high reflectance according to an embodiment of the disclosure.
Figure 9:
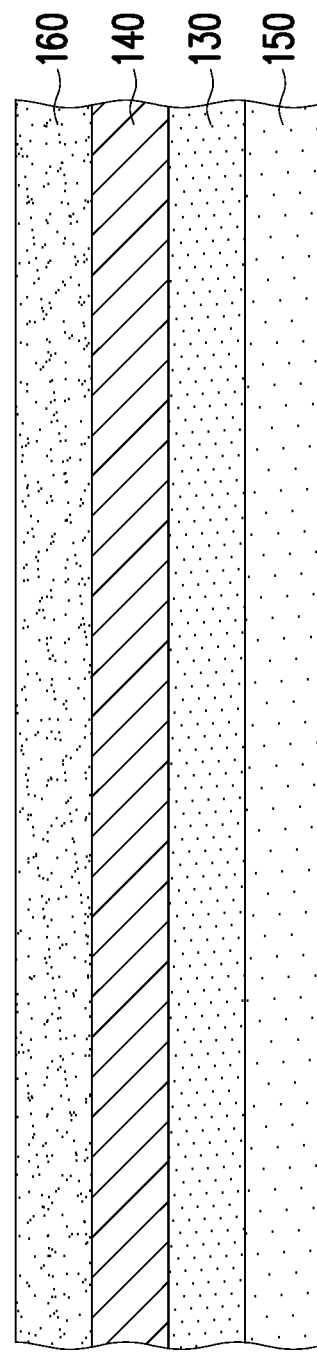

FIG. 8 to FIG. 9 are schematic cross-sectional views showing a partial manufacturing process of a substrate structure with high reflectance according to an embodiment of the disclosure. It should be noted that the substrate structure of the present embodiment is similar to the substrate structure 100 shown in FIG. 5. Therefore, the present embodiment adopts the same or similar reference numbers and some description in the foregoing embodiments. The same or similar reference numbers are adopted to denote the same or similar elements, and the description of the same or similar technical content may be omitted. For the description of the omitted part, reference may be made to the foregoing embodiment, and the description is not repeated herein. Furthermore, for the sake of clarity and simplicity, FIG. 8 and FIG. 9 merely show the laminated structure provided on the structure shown in FIG. 4 (i.e., the structure shown in FIG. 4 is omitted in FIG. 8 and FIG. 9). Referring to FIG. 8 and FIG. 9, the main difference between the substrate structure of the present embodiment and the substrate structure 100 of FIG. 5 will be described below.

Referring to FIG. 4 and FIG. 8, in the embodiment, after the substrate structure shown in FIG. 4 is formed, the insulation layer 130 may be attached to the structure shown in FIG. 4 through an adhesive layer 150. In this embodiment, the insulation layer 130 may include a thermoplastic polyimide (TPI), a resin layer or other similar materials modified or improved based on the above materials. Moreover, the insulating layer 130 may be attached to the first and second patterned circuit layers 120a, 120b and a part of the first surface S1 and the second surface S2 exposed by the first and second patterned circuit layers 120a, 120b through the adhesive layer 150. That is, the adhesive layer 150 is disposed between the first patterned circuit layer (e.g., the first patterned circuit layer 120a shown in FIG. 4) and the first insulation layer 130, and may also be disposed between the second patterned circuit layer (e.g., the second patterned circuit layer 120b shown in FIG. 4) and the first insulation layer 130.

Next, referring to FIG. 9, the metal reflection layer 140 may be formed on the insulation layer 130 by, for example, sputtering, evaporation, electroless plating, electroplating, chemical displacement reaction, or silver mirror reaction, etc., and then a protection layer 160 shown in FIG. 9 is formed on the metal reflection layer 140 to protect the metal reflection layer 140 from scratching or oxidizing. Moreover, the protection layer 160 may include transparent polymer, which usually has high heat resistance (for example, the heat-resistant temperature is substantially greater than or equal to about 200° C.), and the light transmittance is substantially greater than or equal to 80%. In this embodiment, the protection layer 160 may be a polyimide layer, a poly-phenylene sulfide (PPS) layer, a polyphenylene sulfone (PPSU) layer or the like which may be modified or improved based on the above materials, but the embodiment of the disclosure is not limited thereto. One of ordinary skills in the art will appreciate that the protection layer 160 can be applied to the structures disclosed by any embodiments of the present disclosure.

Figure 10:
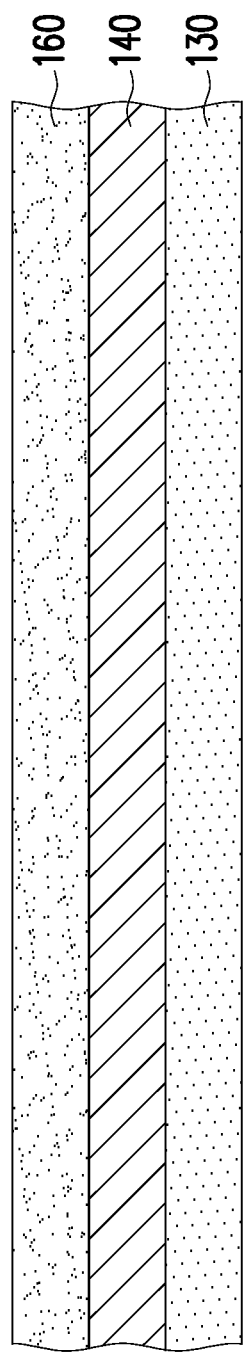
FIG. 10 to FIG. 11 are schematic cross-sectional views showing a partial manufacturing process of a substrate structure with high reflectance according to an embodiment of the disclosure.
Figure 11:
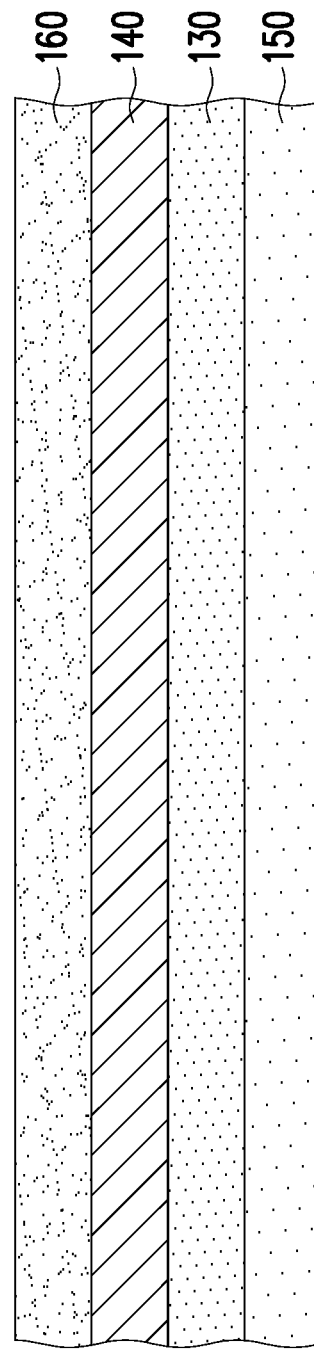

FIG. 10 to FIG. 11 are schematic cross-sectional views showing a partial manufacturing process of a substrate structure with high reflectance according to an embodiment of the disclosure. It should be noted that the substrate structure of the present embodiment is similar to the substrate structure 100 of FIG. 5. Therefore, the present embodiment adopts the same or similar reference numbers and some description in the foregoing embodiments. The same or similar reference numbers are adopted to denote the same or similar elements, and the description of the same or similar technical content may be omitted. For the description of the omitted part, reference may be made to the foregoing embodiment, and the description is not repeated herein. Furthermore, for the sake of clarity and simplicity of the drawings, FIG. 10 and FIG. 11 merely show the laminated structure provided on the structure shown in FIG. 4 (that is, the structure shown in FIG. 4 is omitted in FIG. 10 and FIG. 11). Referring to FIG. 10 and FIG. 11, the main difference between the substrate structure of the present embodiment and the substrate structure 100 of FIG. 5 will be described below.

In this embodiment, the insulating layer 130 may be firstly provided as it is shown in FIG. 10, and then the metal reflection layer 140 may be formed on the insulation layer 130 by, for example, sputtering, evaporation, electroless plating, electroplating, chemical displacement reaction or silver mirror reaction, etc. In some embodiments, the protective layer 160 may then be formed on the metal reflection layer 140 to provide protection to the metal reflection layer 140. Thereafter, the structure shown in FIG. 10 is attached to the structure shown in FIG. 4 by using the adhesive layer 150. In other words, in the embodiment of the present disclosure, as it is shown in FIG. 8 and FIG. 9, the laminated structure including the insulation layer 130, the metal reflection layer 140, and the protection layer 160 may be sequentially formed (or attached) on the structure shown in FIG. 4. Alternatively, as it is shown in FIG. 10 and FIG. 11, the laminated structure including the insulating layer 130, the metal reflection layer 140 and the protection layer 160 may be firstly formed, and then the laminated structure may be attached to the structure shown in FIG. 4. The embodiment of the present disclosure does not limit the manner and sequence for forming the laminated structure including the insulating layer 130 and the metal reflection layer 140.

Figure 12:
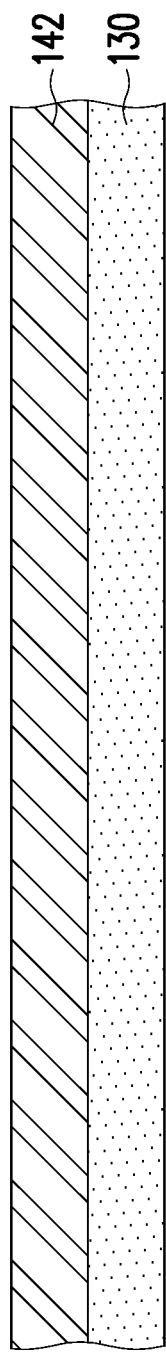
FIG. 12 to FIG. 14 are schematic cross-sectional views showing a partial manufacturing process of a substrate structure with high reflectance according to an embodiment of the disclosure.
Figure 13:
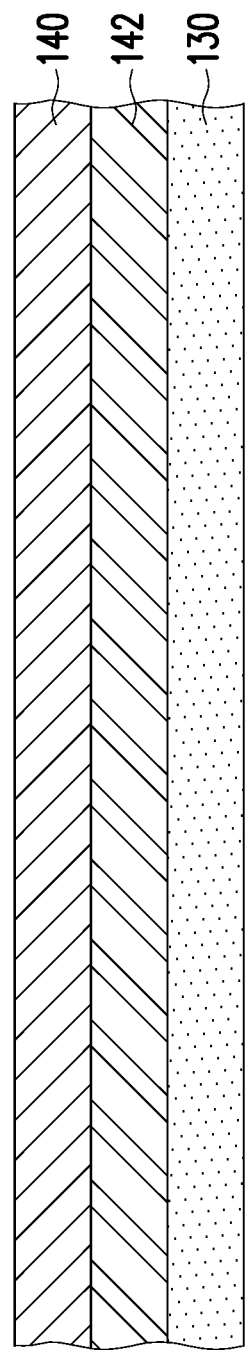
Figure 14:
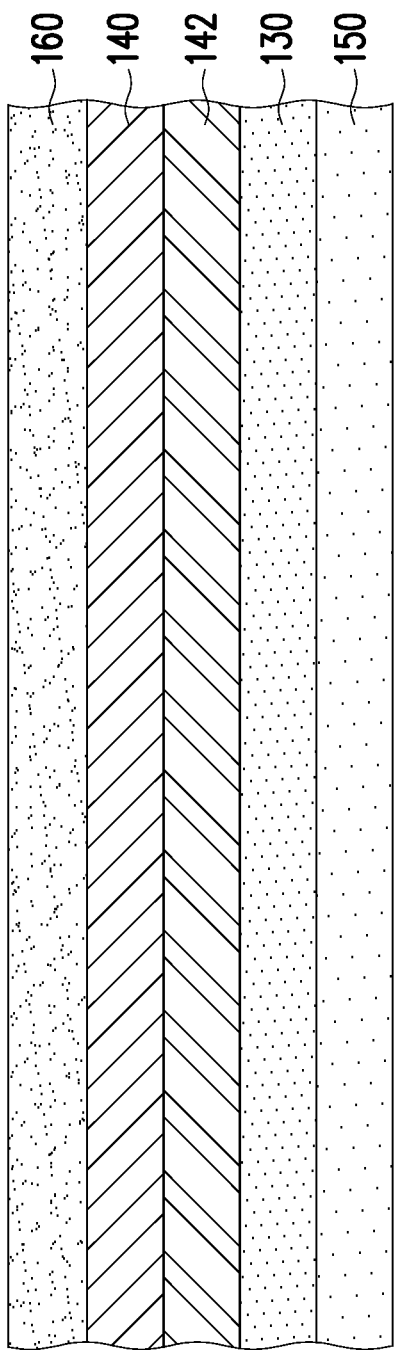

FIG. 12 to FIG. 14 are schematic cross-sectional views showing a partial manufacturing process of a substrate structure with high reflectance according to an embodiment of the disclosure. It should be noted that the substrate structure of the present embodiment is similar to the substrate structure 100 of FIG. 5. Therefore, the present embodiment adopts the same or similar reference numbers and some description in the foregoing embodiments. The same or similar reference numbers are adopted to denote the same or similar elements, and the description of the same or similar technical content may be omitted. For the description of the omitted part, reference may be made to the foregoing embodiment, and the description is not repeated herein. Furthermore, for the sake of clarity and simplicity of the drawings, FIG. 12 to FIG. 14 merely show the laminated structure provided on the structure shown in FIG. 4 (that is, the structure shown in FIG. 4 is omitted in FIG. 12 to FIG. 14). Referring to FIG. 12 to FIG. 14, the main difference between the substrate structure of the present embodiment and the substrate structure 100 of FIG. 5 will be described below.

Referring to FIG. 12, in the present embodiment, a nickel layer 142 may be firstly formed on the first insulation layer 130 to firstly metallize the first insulation layer 130. In the present embodiment, the method of forming the nickel layer 142 may include electroless plating or other suitable method. Next, referring to FIG. 13, a metal reflection layer 140 may be formed on the first insulation layer 130 by, for example, sputtering, evaporation, electroless plating, electroplating, chemical displacement reaction, or silver mirror reaction, etc. As such, the nickel layer 142 is disposed between the first insulation layer 120a and the metal reflection layer 140. In some embodiments, a protection layer 160 as shown in FIG. 14 can be formed over the metal reflection layer 140 to provide protection to the metal reflection layer 140. Thereafter, referring to FIG. 4 and FIG. 15, an adhesive layer 150 is formed between the first patterned circuit layer 120a and the insulation layer 130, such that the structure shown in FIG. 13 is attached to the structure shown in FIG. 4 by using the adhesive layer 150. Of course, in other embodiments, the insulating layer 130 may be firstly attached to the structure shown in FIG. 4 by the adhesive layer 150, and then the laminated structure including the nickel layer, the metal reflection layer 140 and the protection layer 160 is sequentially formed on the insulating layer 130 as it is shown in FIG. 12 to FIG. 14. The embodiment of the present disclosure does not limit the forming manner and sequence of the laminated structure including the insulating layer 130, the nickel layer 142, and the metal reflection layer 140.

Figure 15:
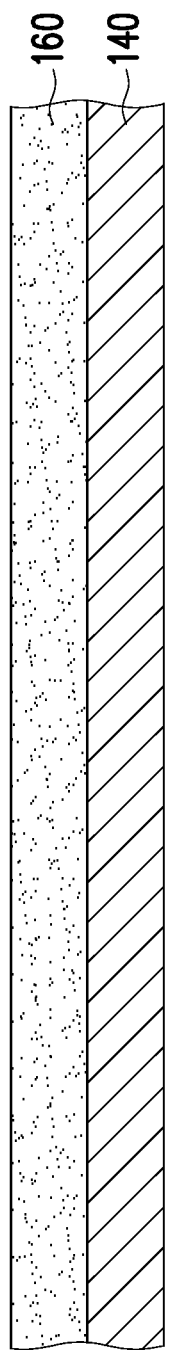
FIG. 15 to FIG. 16 are schematic cross-sectional views showing a partial manufacturing process of a substrate structure with high reflectance according to an embodiment of the disclosure.
Figure 16:
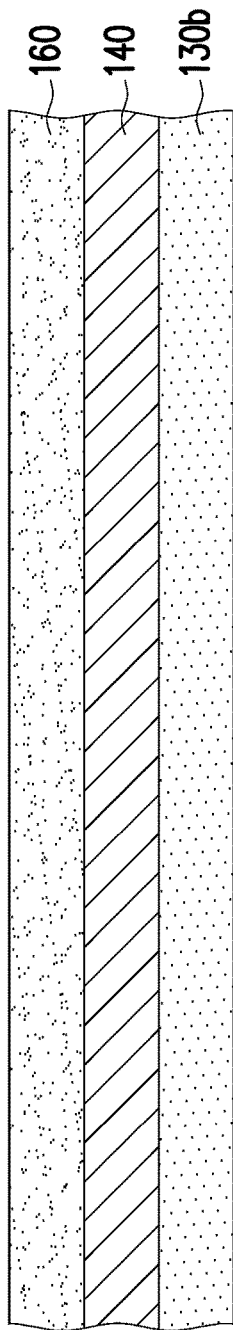

FIG. 15 to FIG. 16 are schematic cross-sectional views showing a partial manufacturing process of a substrate structure with high reflectance according to an embodiment of the disclosure. It should be noted that the substrate structure of the present embodiment is similar to the substrate structure 100 of FIG. 5. Therefore, the present embodiment adopts the same or similar reference numbers and some description in the foregoing embodiments. The same or similar reference numbers are adopted to denote the same or similar elements, and the description of the same or similar technical content may be omitted. For the description of the omitted part, reference may be made to the foregoing embodiment, and the description is not repeated herein. Furthermore, for the sake of clarity and simplicity of the drawings, FIG. 15 and FIG. 16 merely show the laminated structure provided on the structure shown in FIG. 4 (that is, the structure shown in FIG. 4 is omitted in FIG. 15 and FIG. 16). Referring to FIG. 15 and FIG. 16, the main difference between the substrate structure of the present embodiment and the substrate structure 100 of FIG. 5 will be described below.

Referring to FIG. 15 and FIG. 16, in the embodiment, the protection layer 160 may be provided first, and then the metal reflection layer 140 is formed on the (lower) surface of the protection layer 160 by, for example, sputtering, evaporation, electroless plating, electroplating, chemical displacement reaction or silver mirror reaction, etc. In the present embodiment, the protection layer 160 may include transparent polymer, which has a property of high heat resistance (for example, a heat-resistant temperature thereof being substantially higher than or equal to about 200° C.) and a light transmittance thereof is substantially greater than or equal to 80%. In this embodiment, the protection layer 160 may be a polyimide layer, a poly-phenylene sulfide (PPS) layer, a polyphenylene sulfone (PPSU) layer or the like which may be modified or improved according to the above materials, but the embodiment of the disclosure is not limited thereto. Thereafter, referring to FIG. 16, the laminated structure shown in FIG. 15 is attached to the structure shown in FIG. 4 by using an insulation adhesive layer 130b. That is, in the present embodiment, the insulation layer 130b for electrically insulating the first patterned circuit layer 120a from the metal reflection layer 140 is an insulating adhesive to provide both insulation and adhesion functions.

Figure 17:
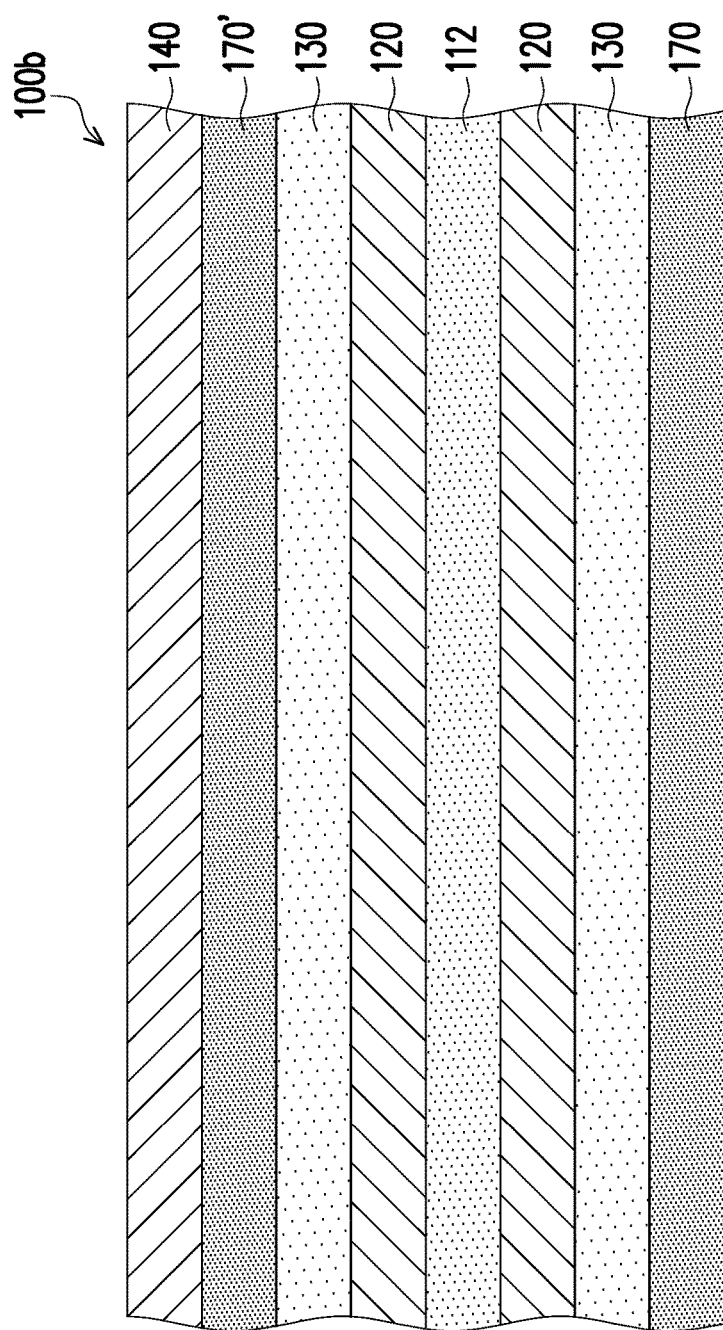
FIG. 17 is a schematic cross-sectional view of a substrate structure with high reflectance in accordance with an embodiment of the present disclosure.

FIG. 17 is a schematic cross-sectional view of a substrate structure with high reflectance in accordance with an embodiment of the present disclosure. It should be noted that the substrate structure of the present embodiment is similar to the substrate structure 100 of FIG. 5. Therefore, the present embodiment adopts the same or similar reference numbers and some description in the foregoing embodiments. The same or similar reference numbers are adopted to denote the same or similar elements, and the description of the same or similar technical content may be omitted. For the description of the omitted part, reference may be made to the foregoing embodiment, and the description is not repeated herein. Referring to FIG. 17, the main difference between the substrate structure 100b of the present embodiment and the substance structure 100 of FIG. 5 will be described below.

Referring to FIG. 17, it should be noted that, for the sake of clarity and simplicity of the drawings, the substrate structure 100b of the present embodiment omits the patterns of the conductive vias 118 and the patterned circuit layer 120 shown in FIG. 5, and also omits the metal foil layers 114, 116, but one of ordinary skills in the art will appreciate that the substrate structure 100b can also have such characteristics described above. In the present embodiment, after the first insulation layer (e.g., polyimide layer) 130 is formed and before the metal reflection layer 140 is formed, an ink layer 170' may be formed on the first insulation layer 130. That is, the ink layer 170' can be disposed between the first insulation layer 130 and the metal reflection layer 140.

Specifically, in the present embodiment, before the metal reflection layer 140 is formed, the ink layer 170' may be formed on the first insulation layer 130 and the ink layer 170 may be formed on the second insulation layer 130. The so-called ink layer may be a baking type ink layer or a liquid photo imageable ink layer as described in the foregoing embodiments, and the manufacturing method and characteristics thereof are not described herein. Then, the metal reflection layer 140 is formed on the ink layer 170'. In the present embodiment, the method of forming the ink layer 170' and the ink layer 170 may include screen printing, jet printing, spray coating, or film attaching, etc.

Figure 18:
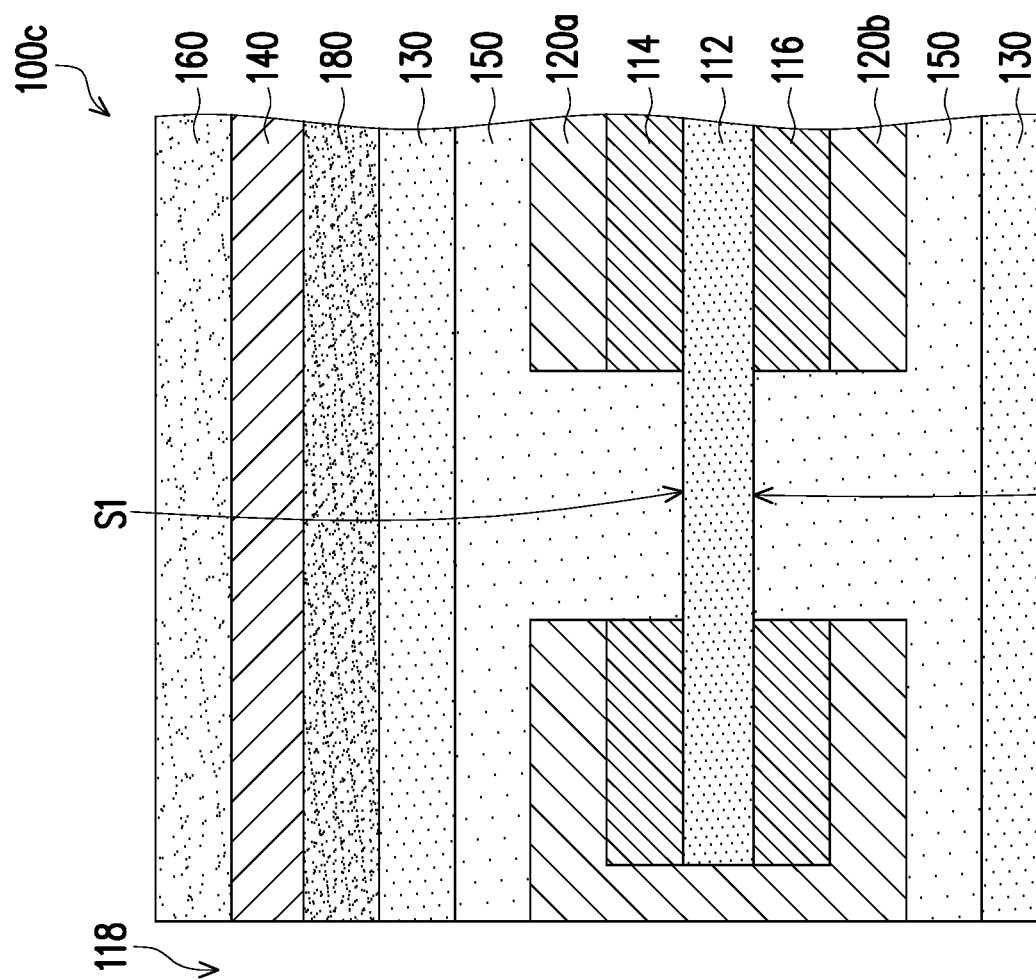
FIG. 18 is a schematic cross-sectional view of a substrate structure with high reflectance in accordance with an embodiment of the present disclosure.
Figure 18:
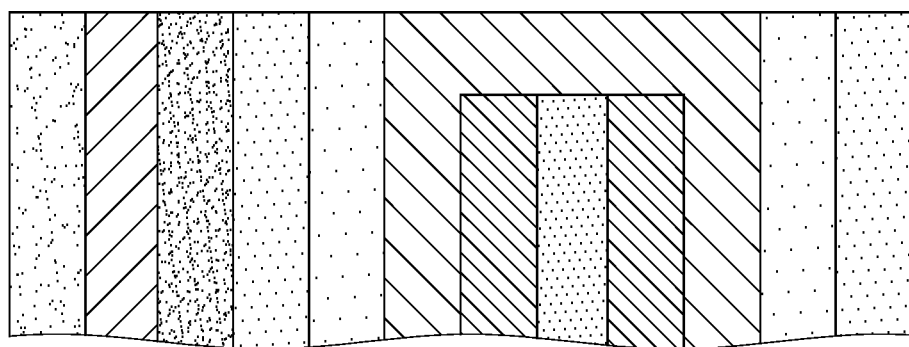

FIG. 18 is a schematic cross-sectional view of a substrate structure with high reflectance in accordance with an embodiment of the present disclosure. It should be noted that the substrate structure 100c of the present embodiment is similar to the substrate structure 100 of FIG. 5. Therefore, the present embodiment adopts the same or similar reference numbers and some description in the foregoing embodiments. The same or similar reference numbers are adopted to denote the same or similar elements, and the description of the same or similar technical content may be omitted. For the description of the omitted part, reference may be made to the foregoing embodiment, and the description is not repeated herein. Referring to FIG. 18, the main difference between the substrate structure 100c of the present embodiment and the substrate structure 100 of FIG. 5 will be described below.

Referring to FIG. 18, in the present embodiment, the substrate structure 100c further includes a bonding layer 180, which is disposed between the first insulation layer 130 and the metal reflection layer 140. Moreover, the bonding layer 180 may be a thermoplastic polyimide (TPI) layer or an adhesive layer. In this embodiment, the method of manufacturing the substrate structure 100c further includes forming a bonding layer 180 on the first insulation layer 130 before the metal reflection layer 140 is formed. Moreover, the method of forming the bonding layer 180 may include spray coating, spraying, dispensing or other suitable methods. Thereafter, the metal reflection layer 140 may be formed on the bonding layer 180 by, for example, sputtering, evaporation, electroless plating, electroplating, chemical displacement reaction, or silver mirror reaction, etc. Then, the protective layer 160 is formed on the metal reflection layer 140 to provide protection to the metal reflection layer 140, and prevent the metal reflection layer 140 from scratched or oxidation. Furthermore, the protection layer 160 may include a transparent polymer, which generally has a property of high heat resistance (for example, a heat-resistant temperature thereof being substantially higher than or equal to about 200° C.) and a light transmittance thereof is substantially greater than or equal to 80%. In this embodiment, the protection layer 160 may be a polyimide layer, a poly-phenylene sulfide (PSS) layer, a polyphenylene sulfonate (PPSU) layer, or other similar materials modified or improved based on the above materials, but the embodiments of the present disclosure are not limited thereto.

Figure 19:
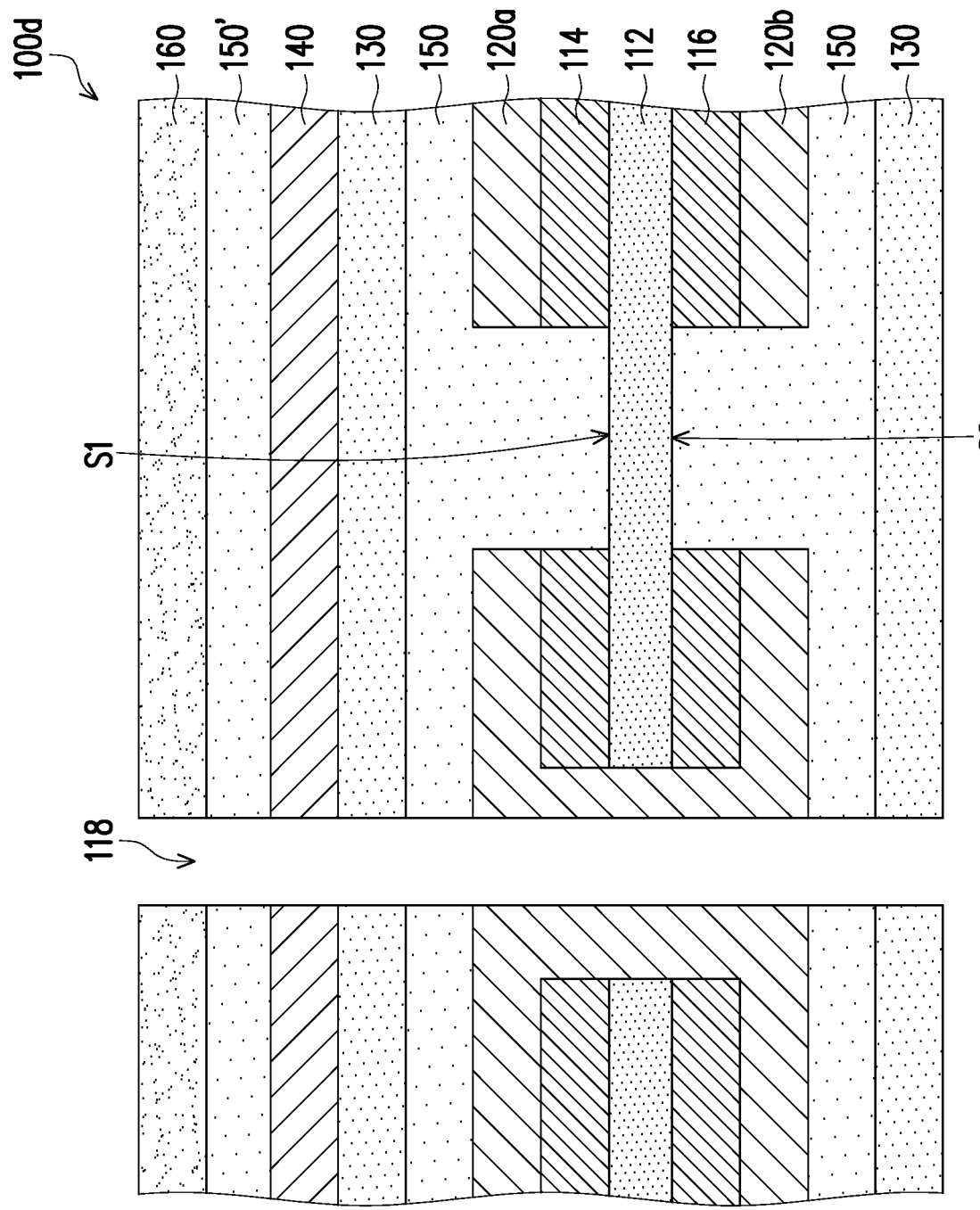
FIG. 19 is a schematic cross-sectional view of a substrate structure with high reflectance in accordance with an embodiment of the present disclosure.

FIG. 19 is a schematic cross-sectional view of a substrate structure with high reflectance in accordance with an embodiment of the present disclosure. It should be noted that the substrate structure 100d of the present embodiment is similar to the substrate structure 100 of FIG. 5. Therefore, the present embodiment adopts the same or similar reference numbers and some description in the foregoing embodiments. The same or similar reference numbers are adopted to denote the same or similar elements, and the description of the same or similar technical content may be omitted. For the description of the omitted part, reference may be made to the foregoing embodiment, and the description is not repeated herein. Referring to FIG. 19, the main difference between the substrate structure 100d of the present embodiment and the substrate structure 100c of FIG. 18 will be described below.

Referring to FIG. 19, in the present embodiment, the substrate structure 100d further includes a transparent adhesive layer 150' disposed between the metal reflection layer 140 and the protection layer 160 to attach the protection layer 160 onto the metal reflection layer 140. Moreover, the transparent adhesive layer 150' can be an optically clear adhesive (OCA) or other suitable transparent adhesive. In this embodiment, the method of manufacturing the substrate structure 100d further includes the following steps. Before the protection layer 160 is formed, the transparent adhesive layer 150' is firstly formed (dispensed) on the metal reflection layer 140, and then the protection layer 160 is disposed on the transparent adhesive layer 150'. Accordingly, the protection layer 160 is fixed onto the metal reflection layer 140 to protect the metal reflection layer 140 from being scratched or oxidized. In addition, the protection layer 160 may include transparent polymer, which generally has a property of high heat resistance (for example, a heat-resistant temperature thereof being substantially higher than or equal to about 200° C.) and a light transmittance thereof is substantially greater than or equal to 80%. In this embodiment, the protection layer 160 may be a polyimide layer, a poly-phenylene sulfide (PSS) layer, a polyphenylene sulfonate (PPSU) layer, or other similar materials modified or improved based on the above materials, but the embodiments of the present disclosure are not limited thereto. In this embodiment, the method of forming the transparent adhesive layer 150' may include spray coating, spraying, dispensing, or other suitable methods. In addition, in other embodiments, the protection layer 160 may be a transparent adhesive such as an optically clear adhesive, and is cured after being disposed on the metal reflection layer 140 to provide protection to the metal reflection layer 140. In such embodiment, the above-mentioned transparent adhesive layer 150' may be omitted.

In sum, the embodiment of the present disclosure provides a substrate structure with high reflectance and a manufacturing method thereof. The substrate structure of the disclosure is provided with a metal reflection layer having a high reflectance, and the reflectance of the metal reflection layer is about 85% or more. Preferably, the reflectance of the metal reflection layer of the disclosure may be greater than or equal to 90%, thereby improving the light reflection efficiency of the substrate structure. In such a configuration, when light-emitting elements such as light-emitting diodes or micro-light-emitting diodes are disposed on the substrate structure to be used as an optical apparatus such as a backlight panel or a light bar, the optical apparatus can be effectively increased in light extraction efficiency.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A substrate structure with high reflectance, comprising:
   a base material comprising a first surface and a second surface opposite to the first surface;
   a first patterned circuit layer disposed on the first surface;

a second patterned circuit layer disposed on the second surface;
a first insulation layer covering the first patterned circuit layer and a portion of the first surface exposed by the first patterned circuit layer;
a metal reflection layer covering the first insulation layer, wherein a reflectance of the metal reflection layer is substantially greater than or equal to 85% and there is no conductive material between the first patterned circuit layer and the metal reflection layer; and
a first ink layer disposed between the first insulation layer and the metal reflection layer.

2. The substrate structure with high reflectance as claimed in claim 1, wherein a material of the metal reflection layer comprises aluminum, silver, gold, copper, ruthenium, chromium, molybdenum, platinum, nickel, iron layers or any combination thereof.

3. The substrate structure with high reflectance as claimed in claim 1, wherein the first insulation layer comprises an ink layer, a polyimide layer, a thermoplastic polyimide layer, a resin layer, a photo-imageable coverlay (PIC), a dry film solder resist (DFSR) layer or an insulation adhesive layer.

4. The substrate structure with high reflectance as claimed in claim 1, further comprising a conductive vias extending through the base material and electrically connecting the first patterned circuit layer and the second patterned circuit layer.

5. The substrate structure with high reflectance as claimed in claim 1, wherein the first ink layer comprises a baking type ink layer or a liquid photo imageable ink layer.

6. The substrate structure with high reflectance as claimed in claim 1, wherein the first ink layer comprises a coloured ink layer.

7. The substrate structure with high reflectance as claimed in claim 1, further comprising a second insulation layer covering the second patterned circuit layer.

8. The substrate structure with high reflectance as claimed in claim 7, further comprising a second ink layer covering the second insulation layer.

9. The substrate structure with high reflectance as claimed in claim 8, wherein the second ink layer comprises a baking type ink layer or a liquid photo imageable ink layer.

10. The substrate structure with high reflectance as claimed in claim 8, wherein the second ink layer comprises a coloured ink layer.

* * * * *